US007829203B2

(12) United States Patent
Steudel et al.

(10) Patent No.: US 7,829,203 B2
(45) Date of Patent: Nov. 9, 2010

(54) POLYMERISABLE COMPOSITIONS AND ORGANIC LIGHT-EMITTING DEVICES CONTAINING THEM

(75) Inventors: Annette Steudel, Cambridge (GB); Alan Mosley, Berkhamsted (GB); Mark Andrews, Oxford (GB); Kal Look, Oxford (GB)

(73) Assignee: CDT Oxford Limited, Cambridgeshire (GB)

( * ) Notice: Subject to any disclaimer, the term of this patent is extended or adjusted under 35 U.S.C. 154(b) by 1345 days.

(21) Appl. No.: 10/506,985

(22) PCT Filed: Mar. 3, 2003

(86) PCT No.: PCT/GB03/00899

§ 371 (c)(1),
(2), (4) Date: Apr. 25, 2005

(87) PCT Pub. No.: WO03/076548

PCT Pub. Date: Sep. 18, 2003

(65) Prior Publication Data

US 2006/0057423 A1    Mar. 16, 2006

(30) Foreign Application Priority Data

Mar. 9, 2002 (GB) .................... 0205592.9
Jun. 18, 2002 (GB) .................... 0213902.0

(51) Int. Cl.
*B32B 27/18* (2006.01)
(52) U.S. Cl. .................... 428/690; 428/515; 428/917
(58) Field of Classification Search ............ 428/690, 428/515, 917
See application file for complete search history.

(56) References Cited

U.S. PATENT DOCUMENTS

| | | | |
|---|---|---|---|
| 5,061,569 A | 10/1991 | Van Slyke et al. | 428/457 |
| 5,100,929 A * | 3/1992 | Jochum et al. | 522/64 |
| 5,141,671 A | 8/1992 | Bryan et al. | 252/301.16 |
| 5,150,006 A | 9/1992 | Van Slyke et al. | 313/504 |
| 5,167,882 A | 12/1992 | Jacobine et al. | 264/22 |
| 5,518,824 A | 5/1996 | Funhoff et al. | 428/690 |
| 5,554,450 A | 9/1996 | Shi et al. | 428/690 |
| 5,593,788 A | 1/1997 | Shi et al. | 428/690 |
| 5,719,467 A | 2/1998 | Antoniadis et al. | 313/506 |
| 5,747,183 A | 5/1998 | Shi et al. | 428/690 |
| 5,853,905 A | 12/1998 | So et al. | 428/690 |
| 5,908,581 A | 6/1999 | Chen et al. | 252/301.16 |
| 5,922,481 A | 7/1999 | Etzbach et al. | 428/690 |
| 5,972,247 A | 10/1999 | Shi et al. | 252/583 |
| 6,020,078 A | 2/2000 | Chen et al. | 428/690 |
| 6,048,573 A | 4/2000 | Tang et al. | 427/66 |
| 6,069,442 A | 5/2000 | Hung et al. | 313/504 |
| 6,107,452 A | 8/2000 | Miller et al. | 528/422 |
| 6,303,238 B1 | 10/2001 | Thompson et al. | 428/690 |
| 2004/0054152 A1 | 3/2004 | Meerholz et al. | 534/15 |

FOREIGN PATENT DOCUMENTS

| | | |
|---|---|---|
| EP | 492 953 A1 | 7/1992 |
| EP | 765 106 A2 | 3/1997 |
| EP | 765 106 A3 | 3/1997 |
| EP | 921 578 A2 | 6/1999 |
| EP | 921 578 A3 | 6/1999 |
| EP | 1 146 574 A2 | 10/2001 |
| EP | 1 146 574 A3 | 10/2001 |
| JP | 05290976 | 11/1993 |
| JP | 10-144469 * | 5/1998 |
| JP | 11-102783 | 4/1999 |
| WO | WO 99/21935 | 5/1999 |
| WO | WO 00/57676 | 9/2000 |
| WO | WO 02/10129 A2 | 2/2002 |

OTHER PUBLICATIONS

"Controlling Charge Injection in Organic Electronic Devices Using Self-Assembled Monolayers", Campbell et al., Appl. Phys. Lett. 71 (24), Dec. 15, 1997, pp. 3528-3530.
Search Report in GB 0205592 dated Nov. 13, 2002.
"Effects of Cross-Linking and Branching on the Molecular Constitution of Diene Polymers", Flory, Presented before the High Polymer Forum at the Atlantic City Meeting of the American Chemical Society, Apr. 1947, pp. 2803-2899.
"Preparation of Thiols", Wardell, Chapter 4, from S. Patel, The Chemistry of the Thiol Groups, John Wiley & Sons, London, 1974, pp. 163-269.
"Thiol-Ene Photopolymers", Jacobine, Chapter 7, Radiat. Curing Polym. Sci. Technol., 1993, pp. 219-268.
Alkylation of Pentaerythritol and Trimethylolpropane, Two Very Hydrophilic Polyols, by Phase-Transfer Catalysis, Nouguier et al., American Chemical Society, 1985, pp. 3296-3298.
"Recent Developments in Molecular Organic Electroluminescent Materials", Chen et al., Macromol. Symp. 125, 1997, pp. 1-48.
"Low Molecular Weight and Polymeric Heterocyclics as Electron Transport/Hole-Blocking Materials in Organic Light-Emitting Diodes", Thelakkat et al., Polymers for Advanced Technologies, 9, 1998, pp. 429-442.

(Continued)

Primary Examiner—Ling-Siu Choi
(74) Attorney, Agent, or Firm—Marshall, Gerstein & Borun LLP

(57) ABSTRACT

Compositions of a mixture of a thiol material and a material that contains a reactive unsaturated carbon-carbon bond that can be polymerised to form a charge-transporting or luminescent film are described, as is an organic light-emitting diode (OLED) device comprising at least one such charge-transporting or emissive layer that has been formed by polymerising a thiol material and an ene material. The process for forming such an OLED, including the deposition of a layer of material comprising the polymerisable composition, from solution, exposing said layer to actinic radiation through a mask, and then optionally developing said film to form a photopatterned film, is also disclosed.

33 Claims, 4 Drawing Sheets

OTHER PUBLICATIONS

"Photo-Cross-Linked Triphenylenes as Novel Insoluble Hole Transport Materials in Organic LEDs", Bacher et al., American Chemical Society, 32, 1999, pp. 4551-4557.

"Very High-Efficiency Green Organic Light-Emitting Devices Based on Electrophosphorescence", Applied Physics Letters, vol. 75, No. 1, Jul. 5, 1999, pp. 4-6.

"Organic Materials for Electronic and Optoelectronic Devices", Shirota, J. Mater. Chem., 10, 2000, pp. 1-25.

"High-Efficiency Red Electrophosphorescence Devices", Adachi et al., American Institute of Physics, vol. 78, No. 11, Mar. 12, 2001, pp. 1622-1624.

International Search Report in PCT/GB03/00899 dated Jun. 20, 2003.

* cited by examiner

POLYMERISABLE COMPOSITIONS AND ORGANIC LIGHT-EMITTING DEVICES CONTAINING THEM

This is the U.S. national phase of International Application No. PCT/GB03/00899 filed Mar. 3, 2003, the entire disclosure of which is incorporated herein by reference.

BACKGROUND OF THE INVENTION

Organic light emitting diodes (OLEDs) are an emerging display technology. In essence an OLED (or organic electroluminescent device) comprises a thin organic layer or stack of organic layers sandwiched between two electrodes, such that when a voltage is applied, visible light is emitted. At least one of the electrodes must be transparent to visible light.

There are two principal techniques that can be used to deposit the organic layers in an OLED: thermal evaporation and solution processing. Solution processing has the potential to be the lower cost technique due to its potentially greater throughput and ability to handle large substrate sizes. However, several manufacturing issues still have to be resolved before solution processing of OLEDs can fulfil its potential. In a multi-colour or full-colour display the emissive organic layers need to be patterned according to the pixel layout. High-resolution displays require a high-resolution pattern for the emissive layer. To date, solution-processing techniques for patterning the emissive layer are far from ideal.

In many cases, the most efficient OLED devices have multi-layer structures (fluorescent emitter: e.g. U.S. Pat. No. 5,719,467 (Hewlett-Packard 1995), EP 0,921,578 (CDT 1998), U.S. Pat. No. 6,048,573 (Kodak 1998), U.S. Pat. No. 6,069,442 (Kodak 1997), U.S. Pat. No. 5,554,450 (Kodak 1995); phosphorescent emitter: e.g. WO 00/57676 and U.S. Pat. No. 6,303,238). Such multi-layer structures can be formed by thermal evaporation, but when solution-processing techniques are used, depositing a second layer may wash away the first layer.

It has been recognised that if a photolithographic technique could be successfully applied to the patterning of the organic layers in an OLED then this would offer many benefits. Photolithographic techniques are established in other industries and can give good resolution and high throughput. However the attempts to use photolithography during the formation of the organic layers in OLEDs have all had only very limited success.

BASF (U.S. Pat. No. 5,518,824) discusses the principle of forming an OLED using a crosslinkable charge-transporting material. The proposed functional groups are acrylates, vinylethers and epoxides. The material is deposited from solution, and then exposed to UV light, which crosslinks the material making it insoluble. Subsequent luminescent or electron transporting layers can be deposited on top of the insoluble layer. BASF mentions that if the UV exposure is carried out through a mask, then the exposed areas will be insoluble and the unexposed areas still soluble, and developing (washing) this film in solvent will remove the unexposed material, leaving the insoluble patterned material. However, this patterning is not demonstrated. BASF discuss doping the film with a fluorescent dye or using a crosslinkable fluorescent dye (U.S. Pat. No. 5,922,481) to form the light-emitting layer. The EL device results reported by BASF from its crosslinked devices are very poor. The two devices reported, which have crosslinked but un-patterned light emitting layers, give light emission only at 87 V and 91 V, respectively, both of which are entirely unacceptable operating voltages for an OLED. Canon (EP 1146574 A2) also demonstrate an OLED with a crosslinked emissive film, but there is still no demonstration of a patterned emissive layer. Further, Bacher et al. (Macromolecules 1999, 32, 4551-4557) demonstrated photo-crosslinking of a hole-transporting (acrylate derivative of triphenylene) material. They produced a patterned photo-crosslinked hole-transport layer on to which they deposited an emissive layer (tris(8-hydroxyquinoline)aluminium: $Alq_3$), and made a functioning OLED device. However, they had not developed a technique for photo-lithographically patterning the emissive layer, and unless the emissive layer can also be patterned, only a monochrome device can be formed. The problem with acrylates in all the prior art is that although the acrylates can give very high resolution in the patterning process, they quench luminescence. The quenching of fluorescence by carbonyl groups is well known (Becker, Theory and Interpretation of Fluorescence and Phosphorescence, Wiley Interscience, NY 1969).

Other authors suggest crosslinking materials by thermally-initiated processes. While such processes do form insoluble films allowing subsequent layers to be deposited on top, they do not allow patterning of the layer. IBM has a patent (U.S. Pat. No. 6,107,452) on thermally/photochemically-induced crosslinking of polymers for use, for example, in light-emitting devices. No patterning was demonstrated.

Bayerl et al. (Macromolecules 1999, 20, 224-228) used crosslinked oxetane-bisfunctionalized N,N,N',N'-tetraphenyl-benzidine as the hole-transporting material in a two-layer device. However, they did not pattern the hole-transporting material. Further work on oxetanes by Meerholz et al. (WO 02/10129) uses cationic photopolymerization to form crosslinked layers. In one instance the emissive layer was patterned. But in many cases the photoacid generated during the polymerization would attack other components of an OLED, in particular organometallic materials, and therefore such procedures would not generally be appropriate for the formation of patterned crosslinked emissive layers in OLED devices.

Photo-polymerisable thiol/ene systems are known for various applications such as printing plates and protective coatings. In these prior applications of thiol/ene systems the resulting polymers have been insulators. Most of the thiol/ene systems mentioned in the prior art contain non-conjugated carbonyl groups rather than aliphatic thiols, as aliphatic thiols can retain a nasty smell. In particular PETMP (Pentaerythritol tetrakis(3-mercaptopropionate) is commonly used as the thiol component (e.g. U.S. Pat. No. 5,100,929 and U.S. Pat. No. 5,167,882).

The present invention is directed to OLEDs that solve some of the problems in the prior art.

SUMMARY OF THE INVENTION

The invention is about directed to a composition of a mixture of a thiol material and an ene material that can be polymerized to form a charge-transporting or luminescent film.

The invention is also directed to an OLED comprising a charge-transporting or emissive layer that has been formed by polymerising a thiol material and an ene material.

The invention is further directed to a process for forming such an OLED that includes depositing a layer of material comprising a thiol and an ene, from solution, exposing said layer to actinic radiation (UV light, visible light, electron beams or X-rays), through a mask, and then optionally developing said film.

According to a first aspect of the invention there is provided a composition comprising a mixture of at least one monomer with the formula:

$$A\text{-}(X)_n \quad (1)$$

and at least one monomer with the formula:

$$B\text{—}(Y)_m \quad (2)$$

where monomers of formula (1) are polymerisable with monomers of formula (2), n and m are integers greater than or equal to 2, such that n and m may be the same or different, X is a group containing a terminal thiol, Y is a group containing a reactive unsaturated carbon-carbon bond, each X may be the same or different, each Y may be the same or different, and A and B are molecular fragments such that at least one of A or B is an organic charge-transporting or organic light-emitting fragment.

According to a second aspect there is a solid film comprising a thermally-induced or radiation-induced polymerisation reaction product of a composition according to the first aspect of the invention.

According to a third aspect of the invention there is provided a solid film comprising a polymer with repeat unit $$\text{-(A-Z—B—W)—} \quad (3)$$

where A and B are as defined above, Z is the addition product of the thiol-containing group, X, and the group containing a reactive unsaturated carbon-carbon bond, Y, and W is the addition product of the group containing a reactive unsaturated carbon-carbon bond, Y and the thiol-containing group, X.

According to a fourth aspect of the invention there is provided an OLED device comprising, laminated in sequence, a substrate, a first electrode, a first optional charge-transporting layer, a light-emitting layer, a second optional charge-transporting layer and a counter electrode wherein at least one of the optional charge-transporting layers and/or the light-emitting layer is according to the second or third aspects of the invention.

In a further aspect of the invention there is provided a process for forming a charge-transporting or emissive layer in an OLED comprising the following steps:
i) depositing a film with a composition according to the first aspect of the invention ii) polymerising said composition by exposing said film to heat or actinic radiation, or more preferably visible or. UV light.

In yet a further aspect of the invention there is provided a process for forming a charge-transporting or emissive layer in an OLED comprising the following steps:
i) depositing a film with a composition according to the first aspect of the invention ii) exposing said film to actinic radiation, or more preferably visible or UV light through a mask iii) washing the exposed film to remove any unexposed material.

DETAILED DESCRIPTION OF THE INVENTION

According to the invention there is provided a composition comprising a mixture of at least one monomer with the formula:

$$A\text{-}(X)_n \quad (1)$$

and at least one monomer with the formula:

$$B\text{—}(Y)_m \quad (2)$$

where monomers of formula (1) are polymerisable with monomers of formula (2), n and m are integers greater than or equal to 2, such that n and m may be the same or different, X is a group containing .a terminal thiol, Y is a group containing a reactive unsaturated carbon-carbon bond, each)(may be the same or different, each Y may be the same or different, and A and B are molecular fragments such that at least one of A or B is an organic charge-transporting or organic light-emitting fragment.

The term reactive unsaturated carbon-carbon bond means a group that will react under the correct conditions with a thiol to form a thioether linkage. Reactive unsaturated carbon-carbon groups are those with carbon-carbon double or triple bonds such as alkenes, alkynes and strained ring systems. In contrast the unsaturated carbon-carbon bonds in an aromatic ring would not react with a thiol to give a thioether linkage and so are un-reactive groups. Reactive unsaturated carbon-carbon bonds are often located at a terminal position in the chain or branch.

X and Y are groups capable of undergoing free-radical induced polymerisation. Optionally, the free-radical induced polymerisation can take place in the presence of a radical initiator. It is desirable that the resulting polymer is insoluble in a solvent that can be used to wash off the un-reacted monomers. Therefore, it is preferred that a crosslinked polymer network is formed, i.e. that n+m>0.4. The exposure to actinic radiation is preferably done in an inert atmosphere to avoid the formation of peroxy groups in the polymer. Following washing or developing of the film, the film may be dried or undergo other post-patterning treatment.

There may be other components in the film in addition to the thiol monomer and the monomer containing a reactive unsaturated carbon-carbon bond. In particular there may be a radical initiator, a luminescent dopant, or a charge-transporting molecule in the mixture.

X and Y are groups capable of undergoing photo-initiated free-radical induced polymerisation. X is a group containing a terminal thiol. Y is a group containing a reactive unsaturated carbon-carbon bond or part of an unsaturated strained ring system. For brevity such a group is sometimes referred to as an ene. X and Y are preferably connected to A and B by spacer units. Under the correct conditions X and Y react to form a thioether linkage. The reaction proceeds by a step growth mechanism, as illustrated in the reaction scheme below (Jacobine, Radiat. Curing Polym. Sci. Technol., 1993, 3, 219-68).

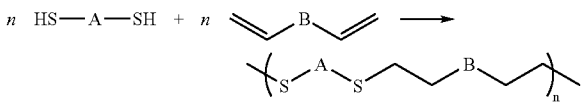

Here, for illustration, the ene is a double bond but it could be a triple bond or an unsaturated strained ring system. Initiation involves the formation of thiyl radicals. Then a thiyl radical attacks the reactive double bond, Y, to give a β-thioether carbon radical, which then abstracts a hydrogen from another thiol group, creating a new thiyl radical, which can propagate the reaction. The thiol is effectively added across the reactive double bond and the chain transferred, hence the need for multi-functional monomers. If each monomer has two functional groups (n=m=2) then a linear polymer can be formed, if at least one of n or m is greater than 2 then a crosslinked polymer can be formed.

In principle, as many X groups as Y groups should be present for complete reaction to occur, if one group is in excess then the excess will remain un-reacted. However, as is well known, in a polymerisation reaction of multi-functional monomers assuming unlimited mobility not all functional groups react (P. J. Flory, J. Am. Chem. Soc. 1947, 69, 2893), so it is not thought to be critical that the number of X and Y groups is balanced.

The polymerisation reaction produce of the thiol monomer (1) and the ene monomer (2) is a polymer with repeat unit

    (3)

where A and B are as defined above, Z is the addition product of the thiol-containing group, X, and the reactive unsaturated carbon-carbon bond, Y, and W is the addition product of the reactive unsaturated carbon-carbon bond, Y and the thiol-containing group, X. Such a polymer comprises a further aspect of the invention.

If A and B have similar molecular weights, both A and B should contain charge-transporting or emissive groups, i.e. be functional. If A and B have dissimilar molecular weights, however, it would be possible for the high molecular weight (i.e. oligomeric) group to be charge transporting or emissive while the low molecular weight group is neither charge transporting nor emissive. However, the resulting polymerised film should have electroluminescent or charge-transporting properties.

The fragments A and B can have different properties depending on required function of the photopolymer layer. In one embodiment, the photopolymer functions as a charge-transport layer in an OLED. In this case preferably both fragments, A and B, should contain charge-transporting groups, unless one fragment has much higher molecular weight than the other in which case said fragment alone can be charge-transporting. In another embodiment the photopolymer forms the emissive layer. In this case, one or both organic fragments can be a light-emitting fragment and the fragments that are not light-emitting are preferably charge transporting, so for example one of A or B is a light-emitting fragment and the other is a charge-transporting fragment. Alternatively neither fragment A nor B is light-emitting but the photopolymer is used as a charge-transporting host matrix for an emissive dopant. If one fragment has much higher molecular weight than the other, said fragment alone can be charge transporting or emissive. It is also possible for an emissive dopant to be used with a photopolymer host that is itself emissive, i.e. where at least one of A and B is a light-emitting fragment.

The invention also provides an OLED device comprising, laminated in sequence, a substrate, a first electrode, a first optional charge-transporting layer, a light-emitting layer, a second optional charge-transporting layer and a counter electrode wherein at least one of the optional charge-transporting layers and/or the light-emitting layer is a solid film comprising a polymerisation reaction product of a composition comprising a mixture of at least two components with the following formulae:

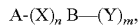

where monomers of one component are polymerisable with monomers of the other component, n and m are integers greater than or equal to 2, such that n and m may be the same or different, X represents a group containing a terminal thiol and Y represents a group containing a reactive unsaturated carbon-carbon bond, and A and B are molecular fragments such that at least one of A or B is an organic charge-transporting or organic (visible) light-emitting fragment.

The invention also provides a method for making such an OLED, whereby the charge-transporting and/or light-emitting film is made by the process of:

i) depositing a film with a composition according to this invention ii) exposing said film to actinic radiation, or more preferably visible or UV light, optionally through a mask, iii) optionally washing the exposed film to remove any unexposed material to leave a pre-determined pattern.

In a typical type of OLED the first electrode is an anode, the first optional charge-transporting layer is a hole-transporting layer, the second charge-transporting layer is an electron-transporting layer, and the counter electrode is a cathode. However in another embodiment the first electrode is a cathode, the first optional charge-transporting layer is an electron-transporting layer, the second charge-transporting layer is a hole-transporting layer, and the counter electrode is an anode. As is well known in the field there may be additional functional layers in the OLED. If the light emitter is phosphorescent, it is particularly beneficially that either the electron-transporting layer also functions as a hole-blocking layer, or there is an additional hole-blocking layer between the light-emitting layer and the electron-transporting layer. A pixellated OLED display can either be a passive-matrix or an active-matrix display. In one embodiment the first charge-transporting layer is a polymerised film according to this invention. In a preferred embodiment the light-emitting layer is a polymerised film according to this invention. In an alternative embodiment, both the first charge-transporting layer and the light-emitting layer are polymerised films according to this invention. It would also be possible for the first charge-transporting layer, the light-emitting layer and the second charge-transporting layer to all be polymerised films according to this invention.

The light-emitting layer in the OLED is preferably patterned, that is a suitable photo-mask is used when the film is exposed to light. This patterning technique allows a multi-colour OLED to be formed. A key advantage of the thiol-ene system is that good resolution can be achieved when it is photo-patterned. A film that is capable of emitting a first colour is deposited, patterned and developed to form pixels capable of emitting a first colour. At this stage, since the film of the first colour is insoluble, it allows a film of a material that is capable of emitting a second colour to be deposited without disrupting the first colour film. This second film is patterned and developed to form pixels capable of emitting the second colour. The process can be repeated to deposit a material capable of emitting a third colour. If present, it may be appropriate to pattern a charge-transporting layer, and this can be done using the same masking technique.

A solution-processing technique, such as spin-coating, ink-jet printing, dip-coating meniscus or roller coating, or other printing or coating technique, or thermal-transfer method is used to deposit the thiol/ene layer which is to be polymerised.

As discussed above, the fragments A and B can contain charge-transporting units. Suitable hole-transporting materials contain π-electron rich moieties. Particularly suitable are triarylamines (for examples see Shirota, J. Mater. Chem., 2000, 10, 1-25). The charge-transporting fragment A or B can be based on known hole-transporting arylamine materials such as those with the formula

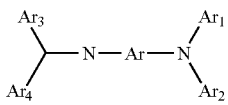

where Ar is an optionally substituted aromatic group, such as phenyl, or

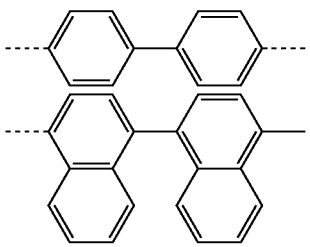

and $Ar_1$, $Ar_2$, $Ar_3$ and $Ar_4$ are optionally substituted aromatic or heteroaromatic groups (Shi et al (Kodak) U.S. Pat. No. 5,554,450. Van Slyke et al, U.S. Pat. No. 5,061,569. So et al (Motorola) U.S. Pat. No. 5,853,905 (1997)). Ar is preferably biphenyl. In the current invention at least two of $Ar_1$, $Ar_2$, $Ar_3$ and $Ar_4$ are bonded to either a thiol group, X, or a group containing a reactive unsaturated carbon-carbon bond, Y. $Ar_1$ and $Ar_2$, and/or $Ar_3$ and $Ar_4$ are optionally linked to form a N containing ring, for example so that the N forms part of a carbazole unit e.g.

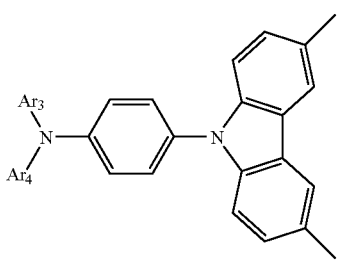

Bipolar materials that can form a bipolar fragment A or B transport both holes and electrons. Suitable materials preferably contain at least two carbazole units (Shirota, J. Mater. Chem., 2000, 10, 1-25).

Electron-transporting materials that can form an electron-transporting fragment A or B contain π-electron deficient moieties. Examples of suitable π-electron deficient moieties are oxadiazoles, triazines, pyridine, pyrimidine, quinoline, and quinoxaline (Thelakkat, Schmidt, Polym. Adv. Technol. 1998, 9, 429-42). Specific examples include $Alq_3$ [Aluminium tri(8-hydroxyquinoline)], TAZ (3-phenyl-4-(1-naphthyl)-5-phenyl-1,2,4-triazole) and OXD-7 (1,3-bis(N,N-t-butyl-phenyl)-1,3,4-oxadiazole).

As discussed earlier, one of the fragments A or B may be neither charge transporting nor luminescent, provided that the other is. If such a fragment is going to be used, it is preferred that it has a relatively low molecular mass and is the basis for a multi-functional monomer. A suitable fragment is based on pentaerythritol. For example monomer (1) could have the formula $C(CH_2O(CH_2)_nX)_4$ where n is an integer from 1 to 6, or monomer (2) could have the formula $C(CH_2O(CH_2)_nY)_4$ where n is an integer from 1 to 6. A tetra-functional non-charge transporting thiol formed from the pentaerythritol fragment (see example 2) can be combined with a difunctional charge transporting ene to form a cross-linked charge-transporting film.

Light emission may be via fluorescence or phosphorescence.

According to IUPAC fluorescence is defined as spontaneous emission of radiation (luminescence) from an excited molecular entity with the formation of a molecular entity of the same spin multiplicity. Suitable fluorescent light-emitting materials are many organic molecules and complexes of metals of group 2, 12, 13 or light d-block metals with organic ligands. According to the colour of the light emission these materials can be divided into three groups, blue, green and red emitters.

Suitable fluorescent blue emitters are e.g. stilbenes, coumarins, anthracenes (Kodak U.S. Pat. No. 5,972,247 (1999). Toshio et al (Toyo Ink) EP 0765106 (1996)) and perylenes (So et al (Motorola) U.S. Pat. No. 5,853,905 (1997). Lee et al (Motorola) U.S. Pat. No. 5,747,183 (1996)). Also suitable are blue-emitting aluminium complexes (Bryan et al (Kodak) U.S. Pat. No. 5,141,671. Van Slyke et al (Kodak) U.S. Pat. No. 5,150,006)). Suitable green emitters are $Alq_3$ (Chen and Tang, Macromol. Symp. 1997, 125, 1-48), coumarins (Chen et al (Kodak) U.S. Pat. No. 6,020,078) and quinacridone (Shi et al (Kodak) U.S. Pat. No. 5,593,788). Suitable red emitters are DCM and its derivatives (Chen et al, U.S. Pat. No. 5,908,581). The fluorescent material can be a molecular or dendritic species. For examples of suitable fluorescent dendrimers see Samuel et al. (WO 99/21935). The light-emitting material may be a dopant in the crosslinked charge-transporting matrix (comprising charge-transporting fragments A and/or B), in which case the emission spectrum of the charge-transporting matrix should overlap the absorption spectrum of the light-emitting dopant. Alternatively, the light-emitting material may be modified so that it is itself a monomer, i.e. the light emitting material is the fragment A or B of a polymerisable material. The dopant can be a single material or a mixture of compounds. The concentration of the dopants is chosen so as to maximise colour purity, efficiency, and lifetime.

According to IUPAC the term phosphorescence designates luminescence involving change in spin multiplicity, typically from triplet to singlet or vice versa. The luminescence from a quartet state to a doublet state is also phosphorescence.

Suitable phosphorescent light-emitting materials are heavy transition metal complexes. In particular organometallic complexes of iridium for example $Ir(ppy)_3$ (fac tris(2-phenylpyridine)iridium), which gives green emission (see Baldo et al., Appl. Phys. Lett., 75 no. 1, 1999, 4), or $(btp_2)Ir(acac)$ (bis(2-(2'-benzo[4,5-α]thienyl) pyridinato-N,$C^{3+}$) iridium (acetyl-acetonate)), which gives red emission (see Adachi et al., Appl. Phys. Let., 78 no. 11, 2001, 1622) are suitable. It could also be a complex of platinum, for example 2,3,7,8,12,13,17,18-octaethyl-21H,23H-porphine platinum (PtOEP) which gives red emission. The phosphorescent material can be a molecular or dendritic species. The light-emitting material may be a dopant in the crosslinked charge-transporting matrix (comprising charge-transporting fragments A and/or B), in which case the charge-transporting can be bipolar, hole transporting or electron-transporting. Alternatively, the light-emitting material may be modified so that it is itself a monomer, i.e. the light-emitting material is the fragment A or B of a crosslinkable material. The dopant can be a single material or a mixture of compounds. The concentration of the dopants is chosen so as to maximise colour purity, efficiency, and lifetime.

The concentration of the phosphorescent light-emitting fragment in the host material should be such that the film has a high photoluminescent and electroluminescent efficiency. If the concentration of the emissive species is too high, quenching of luminescence can occur. A concentration in the range 0.01-49 molar %, is generally appropriate.

Preferred examples of thiol monomers and ene monomers, suitable for use with a phosphorescent dopant, are shown in FIGS. 1 and 2, respectively. A di-functional monomer derivative of CBP used with a tri-functional monomer derivative of TCTA will form a crosslinked polymer. Alternatively a crosslinked polymer would be formed if both the thiol and ene monomers were tri-functional derivatives of TCTA.

There is typically a spacer chain between the charge-transporting or light-emitting moiety and the polymerisable thiol or the reactive unsaturated carbon-carbon bond. Such a spacer improves the film forming properties of the material, allowing good quality films to be deposited from solution. The spacer also aids the polymerisation process. The spacer should not contain any carbonyl groups (including those in the form of esters, amides etc.). The spacer can comprise alkyl, ether, thioether, aryl, siloxane, amine or unsaturated groups, or heteroatoms such as silicon, boron or phosphorus. In fact neither A-(X)$_n$ nor B—(Y)$_m$ should contain any carbonyl groups.

Synthetic routes to form thiol-containing materials including those starting from thiourea, thiosulfate ions, thiol esters and dithiocarbamates can be found in S. Patai, *Chapter 4, The Chemistry of the Thiol Groups*, John Wiley & Sons, London 1974.

A synthetic route to alkene materials that have an ether linkage between the reactive unsaturated carbon-carbon bond and the rest of the molecule, is via a nucleophilic substitution in the presence of base as shown in FIG. 2 (the step from compound 10c to compound 10). *Synthesis of ethers, Houben-Weyl, Methoden der organische Chemie, V*1/3, Georg Thieme Verlag, Stuttgart 1965.

Thiol-ene mixtures can be easily thermally-polymerized and photo-polymerised. Photo-polymerization has the advantage that good resolution patterned films can be obtained and hence photo-polymerization is preferred for OLED applications. The reactive unsaturated carbon-carbon bonds are preferably electron-rich or they form part of a strained ring system. In this later case, reaction of the unsaturated carbon-carbon bond with a thiol will then release the ring strain. The reactive unsaturated group consists preferably of a norbornyl or vinylether moiety, other useful enes consist of allylether, or unsaturated cyclic systems. For the thiol-ene systems there are suitable initiators for activation by either UV light or visible light. For successful initiation, it is generally preferable to use a wavelength of light that is absorbed by the initiator but not strongly absorbed by the other components of the film. In this way the initiator functions well and photo-degradation of the film is minimised.

The thiol-ene systems mentioned here do not contain any carbonyl groups therefore no quenching of luminescence is observed. Unlike previously proposed photo-polymerisable systems proposed for OLEDs the thiol-ene systems is unique in offering a combination of high-resolution patterning with minimum luminescence quenching.

EXAMPLES

Example 1

Figure 1:
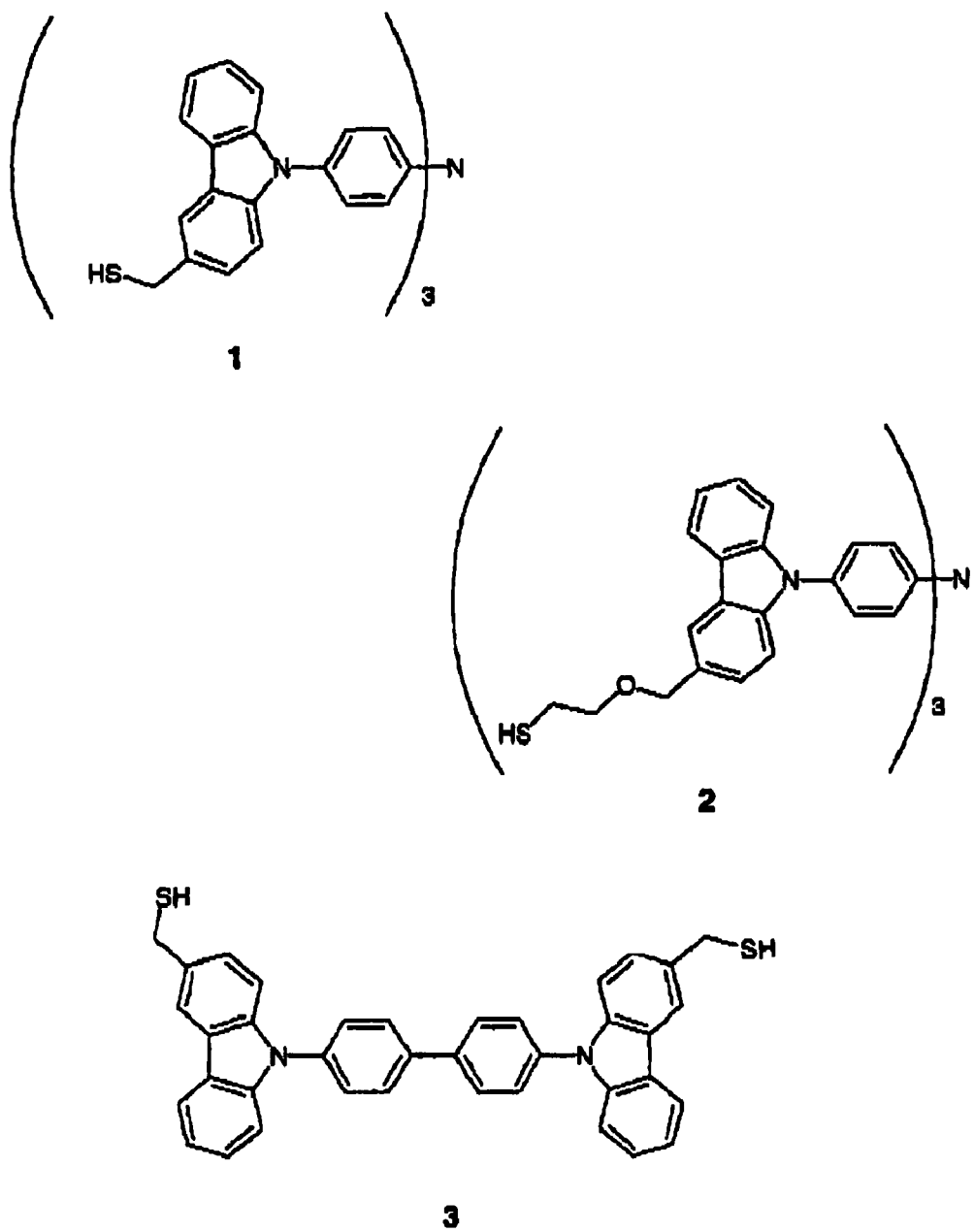
FIG. 1 shows examples of charge-transporting thiols.

Synthesis of 4,4',4"-Tris(3-vinylcarbazol-9-yl)triph-enylamine and 4,4',4"-Tris[3-(2-thio-1-ethyl)carba-zol-9-yl]triphenylamine The outline for the synthesis of the materials 22 and 24 is given in the following scheme.

Scheme 1: Synthesis of 22 and 24 derivatives

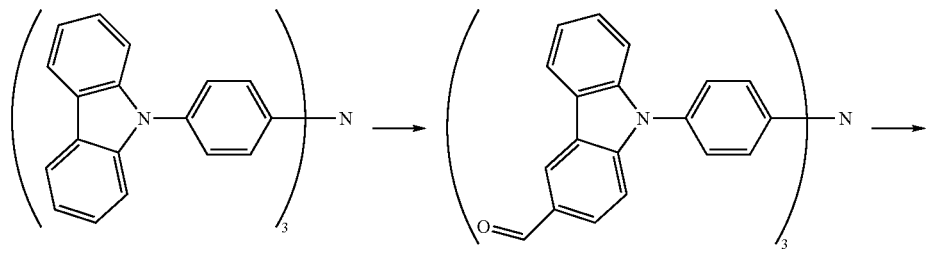

20  21

-continued

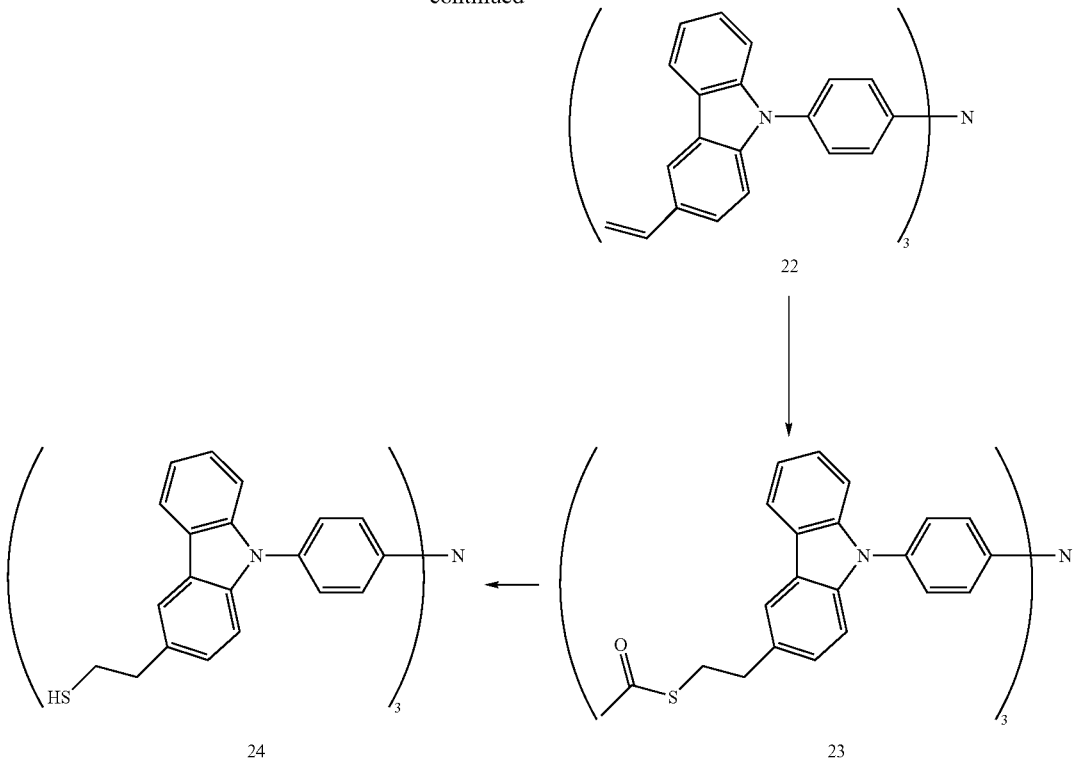

Synthesis of 4,4',4''-Tris(carbazole-9-yl)triphenylamine (20)

Potassium carbonate (52.0 g, 383 mmoles) was dried under high vacuum in an oil bath at 220° C. with vigorous stirring for 90 minutes. Carbazole (20.9 g, 125 mmoles, previously recrystallised from toluene) and tris(4-bromophenyl)amine (20.1 g, 47 mmoles) were added and placed under high vacuum for 10 minutes. Anhydrous toluene (175 cm$^3$) was then added and degassed under high vacuum for 10 minutes. Palladium acetate (280 mg, 1.25 mmoles) and tris-tert-butylphosphine (750 mg, 3.71 mmol) were then added and the reaction mixture was degassed under high vacuum for 10 minutes and then refluxed under nitrogen for 18 hours before being allowed to cool. As TLC analysis showed some unreacted material, anhydrous toluene (100 cm$^3$) was added and the reaction mixture was refluxed for a further 4 hours and then allowed to cool. The reaction mixture was diluted with hexane (500 ml) and the reaction mixture was stirred at room temperature for a further 1 hour and the reaction mixture was filtered. The residue was washed with hexane (3×200 ml), water (5×200 ml) and hexane (3×200 ml). The residue was recrystallised from toluene twice to give white crystals 4,4',4''-Tris(carbazole-9-yl)triphenylamine (20) (25.8 g, 74%) with a melting point 298-299° C.

Synthesis of 4,4',4''-Tris(3-formylcarbazole-9-yl)triphenylamine (21)

Phosphorus oxychloride (11.5 ml, 19.0 g, 115 mmol) was added dropwise to a stirring mixture of N,N-dimethylformamide (4.78 ml, 4.51 g, 61.7 mmol) and 4,4',4''-Tris(carbazole-9-yl)triphenylamine (TCTA) (20) (7.26 g, 9.81 mmol) and the resulting mixture was stirred at room temperature for 5 minutes then heated to 90° C. for 5 days. The reaction mixture was poured into water (800 ml) and the flask containing the product was placed in the ultrasonic bath for 2 hours to break up the material. The mixture was stirred for 2 hours then filtered. The residue was washed with water (500 ml) followed by hexane (500 ml) then dried at the pump for 2 hours. The crude product, a brown solid, was heated at reflux with acetone (3×400 ml), cooled to room temperature and filtered. The product 4,4',4''-Tris(3-formylcarbazole-9-yl)triphenylamine (21) (6.09 g, 75%) was obtained as a pale brown solid with melting point 225-227° C. (dec).

Found: C, H, N, Calculated for $C_{57}H_{36}N_4O_3$: C, 82.99: H, 4.40; N, 6.79.

$^1$H n.m.r.: (300 MHz, CDCl$_3$): δ (ppm) 7.36-7.57, m, 24H, aromatic H, 9.97, d, 3H, J 9.10 Hz, aromatic H, 8.21, d, 3H, J 6.75 Hz, aromatic H, 8.66, s, 3H, aromatic H; 10.10, s, 3H, CHO. $\lambda_{max}$(CH$_2$Cl$_2$): 233 nm (ε 82 144/Lmol$^{-1}$ cm$^{-1}$), 291 (74 701), 332 (56 562).

Band gap: 3.31 eV. FTIR (solid): 3048, 2716, 1685, 1593, 1505, 1311, 1232, 1185, 808, 766, 741, 728 cm$^{-1}$.

Synthesis of 4,4',4''-Tris(3-vinylcarbazol-9-yl)triphenylamine (22)

Dry THF (20 ml) was added under nitrogen to a deoxygenated mixture of methyltriphenyl phosphonium bromide (10.5 g, 29.3 mmol) and potassium tert-butoxide (3.28 g, 29.2 mmol) and the resulting mixture was stirred at room temperature for 15 minutes. The trialdehyde 21 (5.37 g, 6.51 mmol) was added under nitrogen and the reaction mixture was stirred at room temperature for a further 2 hours. When the reaction was complete (TLC on silica using dichloromethane as the eluent) the solvent was removed under reduced pressure and then suspended in dichloromethane. The crude reaction in dichloromethane was filtered through a silica plug using 50% dichloromethane/hexane as the eluent. Recrystallisation of the product 22 was attempted using various solvents without success and the product was purified further by chromatography on silica using 50% dichloromethane/hexane as the eluent. The product 4,4',4''-Tris(3-vinylcarbazol-9-yl)triphenylamine (22) (4.11 g, 77%) was obtained as a pale yellow solid with melting point 226-228° C. (gel). Found: C, 87.70; H, 4.93; N, 6.47. Calculated for $C_{60}H_{42}N_4$: C, 87.99;H, 5.17; N, 6.84. $^1$H n.m.r. (CDCl$_3$): δ (ppm) 5.22, dd, 3H, vinylic H, $J_{cis}$ 10.83, $J_{gem}$, 0.88 Hz: 5.79, dd, 3H, $j_{trans}$ 17.56, $J_{gem}$, 0.88 Hz; 6.92, dd, 3H, vinylic H, $J_{trans}$ 17.56, $J_{cis}$ 10.83 Hz; 7.30, td, 3H, aromatic H, J 7.90, J 1.17 Hz; 7.41-7.58, m, 24H, aromatic H; 8.12-8.17, m, 6H, aromatic H. $\lambda_{max}$(CH$_2$Cl$_2$):248 nm (ε 119 504/Lmol$^{-1}$ cm$^{-1}$), 284 (102668), 328 (66573). Band gap: 3.40 eV. FT-IR (solid): 3043, 1625, 1599, 1505, 1457, 1311, 1227, 885, 808, 745 cm$^{-1}$. PL (solution): 393 nm. CIE co-ordinates (x=0.165, y=0.044).

Synthesis of 4,4,4''-Tris[3-(2-acetylthio-1-ethyl)carbazol-9-yl]triphenylamine (23)

Thiolacetic acid was purified by distillation prior to use. Thiolacetic acid (5 ml) was added to trivinyl derivative (22) (1.60 g, 1.95 mmol) that had been cooled in ice. The reaction mixture was warmed to room temperature and AIBN (a few mg) was added. The resulting mixture was heated at reflux for 1 hour (until the reaction was complete by TLC using DCM as the eluent. The excess thiol acetic acid was removed under reduced pressure and the product was dissolved in a minimum volume of dichloromethane. The crude product was purified by chromatography on silica using dichloromethane as the eluent. The product was obtained as a yellow film. Attempts were made to recrystallise the product without success. The product was purified by chromatography once more using the above-mentioned conditions. The product 4,4',4''-tris[3-(2-acetylthio-1-ethyl)carbazol-9-yl]triphenylamine (23) was obtained as a yellow solid (1.27 g, 62%) with melting point 128-130° C. Found: C, 71.67; H, 4.79; N, 4.81. Calculated for $C_{66}H_{54}N_4O_3S_3$: C, 75.69; H, 5.20; N, 5.35. Calculated for $C_{66}H_{54}N_4O_3S_3$ (1 mol DCM): C, 71.07; H, 4.98; N, 4.95. $^1$H n.m.r. (CDCl$_3$): δ(ppm) 2.36, s, 9H, CH$_3$; 3.08, t, 6H, CH$_2$S, J 8.25 Hz; 3.23, t, 6H, CH$_2$, J 8.25 Hz; 7.25-7.33, m, 3H, aromatic H, 7.39-7.59, m, 21H, aromatic H, 7.98, d, 3H, aromatic H, $J_{meta}$ 1.10 Hz; 8.13, d, 3H, aromatic H, $J_{ortho}$ 7.07 Hz. $\lambda_{max}$(CH$_2$Cl$_2$): 240 nm (ε 109 958/Lmol$^{-1}$ cm$^{-1}$), 297 (52 652), 328 (43 308). Band gap: 3.45 eV. FT-IR (solid): 3043, 2924, 1684, 1601, 1505, 1484, 1456, 1311, 1271, 1230, 1128, 1104, 944, 745 cm$^{-1}$.

Synthesis of 4,4',4''-Tris[3-(2-thio-1-ethyl)carbazol-9-yl]triphenylamine (24)

The trithioester was dissolved in THF (20 ml) then was added to a solution of potassium hydroxide (1.28 g, 320 mmol) in water (20 ml). The resulting mixture was heated at reflux for 2 hours. The reaction mixture was cooled to room temperature and was acidified to ph 6 with a dilute solution of HCl (0.1 M). The product was extracted into dichloromethane (3×40 ml) and the organic phase was washed with water (100 ml) and brine (50 ml), dried (MgSO$_4$) and filtered. The filtrate was evaporated to dryness to give the crude product as a white solid. The crude product was purified by chromatography on silica using dichloromethane as the eluent. The product of 4,4',4''-tris[3-(2-thio-1-ethyl)carbazol-9-yl]triphenylamine (24) obtained was a white solid (528 mg, 53%) with melting point 185-188° C. Found: C, 76.72; H, 5.37; N, 5.96. Calculated for $C_{60}H_{48}N_4S_3$: C, 78.22; H, 5.25; N, 6.08. Calculated for $C_{60}H_{48}N_4S_3$ (1 mol H$_2$O): C, 76.72; H, 5.37; N, 5.96). $^1$H n.m.r. (CDCl$_3$, 300 MHz): δ(ppm) 1.45, s, 3H, SH J 7.70 Hz; 2.91, q, 6H, CH$_2$S, J 7.70 Hz; 3.16, t, 6H, CH$_2$, J 7.42 Hz; 7.22-7.34, m, 3H, aromatic H, 7.36-7.60, m, 21H, aromatic H, 7.97, d, 3H, aromatic H, $J_{meta}$ 1.10 Hz; 8.13, d, 3H, aromatic H, $J_{ortho}$ 7.07 Hz. $\lambda_{max}$(CH$_2$Cl$_2$): 245 nm (ε 100 508/Lmol$^{-1}$ cm$^{-1}$), 298 (57 145), 330 (48 854). Band gap: 3.44 eV. FT-IR (solid): 3043, 2963, 2926, 2556, 1601, 1505, 1484, 1456, 1310, 1262, 1229, 1103, 1064, 1014, 802, 769, 742, 726 cm$^{-1}$.

Fabrication of a Phosphorescent Emitter Doped Photo-Crosslinkable OLED from 4,4',4''-tris[3-(2-thio-1-ethyl)carbazol-9-yl]triphenylamine (24) and 4,4',4''-tris(3-vinylcarbazol-9-yl)triphenylamine (22)

Ir(ppy)$_3$ (8 wt %) (3.4 mg), 4,4',4''-tris[3-(2-thio-1-ethyl) carbazol-9-yl]triphenylamine (24) (19.3 mg) and 4,4',4''-tris (3-vinylcarbazol-9-yl)triphenylamine (22) (19.3 mg) were dissolved in pure chloroform at total concentration 7 mg ml$^{-1}$. The solutions were spun onto ITO coated glass substrates (previously cleaned by ultrasonication in commercial detergent and thorough rinsing with DI water). Prior to spin-coating the dry ITO coated glass was plasma-treated in an Emitech K1050X plasma unit (process gas oxygen, 100 W, 2 min). Solutions were spun onto the ITO substrates at 2000 rpm with acceleration 500 rs$^{-1}$ for a total of 30 s giving an emitting organic layer of thickness ca 50 nm. Films were then photopolymerized under an inert atmosphere (N$_2$) using a Hanovir UVA 250W UV source. The films were irradiated for 6 minutes through a 5"×5" glass photo mask (cut-off 360 nm) giving a rectangular exposed area 15×20 mm. Overlap of this area with ITO anode and deposited aluminium cathode defines active areas consisting of 6 pixels measuring 4×5 mm. The photopolymerized films were developed by rinsing with pure toluene, dried under a stream of dry nitrogen and transferred to the evaporator (KJLesker) for completion of the OLED by evaporation of ETL/HBL and top electrode. TPBI deposited by vacuum evaporation formed the ETL/HBL (50 nm). LiF (1.2 nm) and Aluminium (100-150 nm) deposited by vacuum evaporation formed the cathode.

Device performance:

0.9 cd/A (@103.5 cd/m$^2$), 0.28 lm/W (@10.2 V), turn on voltage (ToV) 6.0 V

Max EQE 1.0 cd/A (@40 cd/m$^2$, 0.36 lm/W, 8.6 V)

Max PE 0.42 lm/W (@7.5 cd/m$^2$, 0.94 cd/A, 7.1 V)

CIE coords. x=0.34 y=0.59

Figure 3:
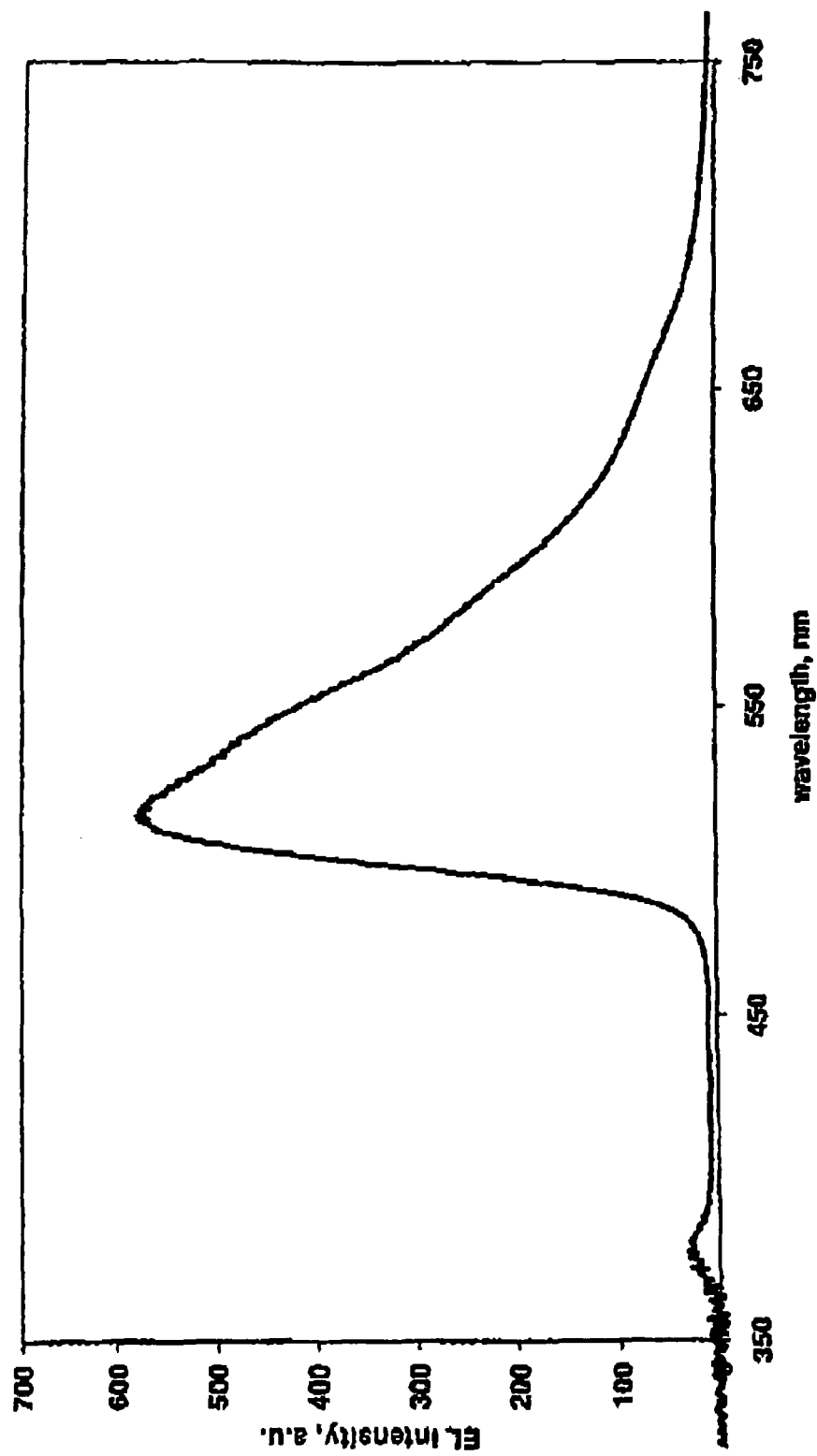
FIG. 3 shows the electroluminescence emission spectrum of the device in example 1.

The EL emission spectrum is shown in FIG. 3.

Figure 4:
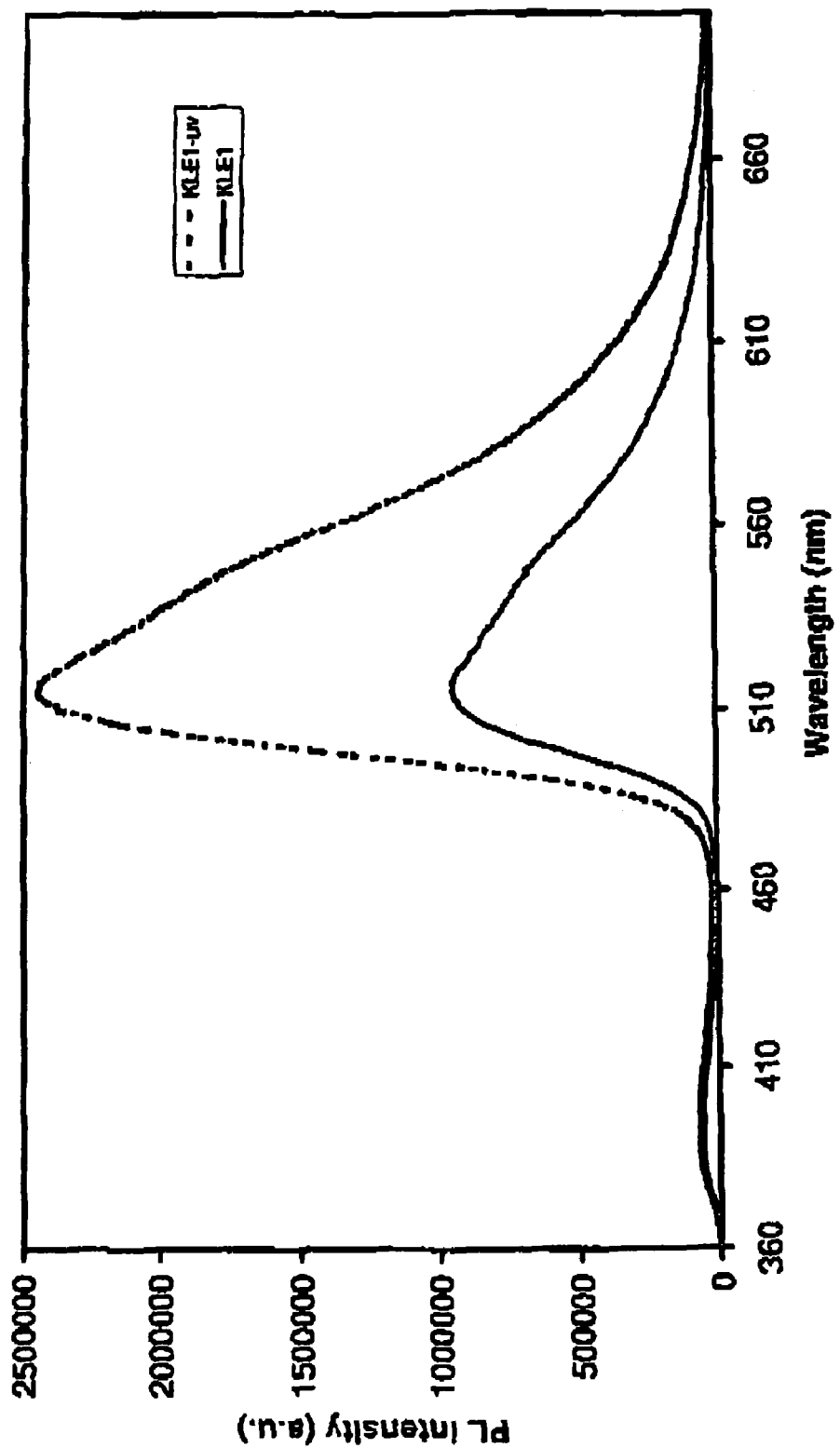
FIG. 4 shows the photoluminescence emission spectrum from a film of a thiol and an ene doped with Ir(ppy)$_3$ before and after exposure to UV (example 1).

FIG. 4 shows the PL emission spectrum of a spin-coated film of the materials, before and after exposure to UV light i.e. before and after photopolymerisation. The film was prepared from a solution containing 10 wt % Ir(ppy)$_3$ and a 1:1 ratio of 4,4',4''-tris[3-(2-thio-1-ethyl)carbazol-9-yl]triphenylamine (24) and 4,4',4''-tris(3-vinylcarbazol-9-yl)triphenylamine (22). The photopolymerisation was carried out as described above.

Example 2

Synthesis of Materials

Synthesis of tetraallylpentaerythritol (NME1)

Procedure carried out as directed in literature:—

Nouguier R, Mchich M, *J. Org. Chem.* 1985, 50, (3296-3298)

Synthesis of tetrathiopropylpentaerythritol (MAT1)

This is a two-step synthesis starting from the material NME1.

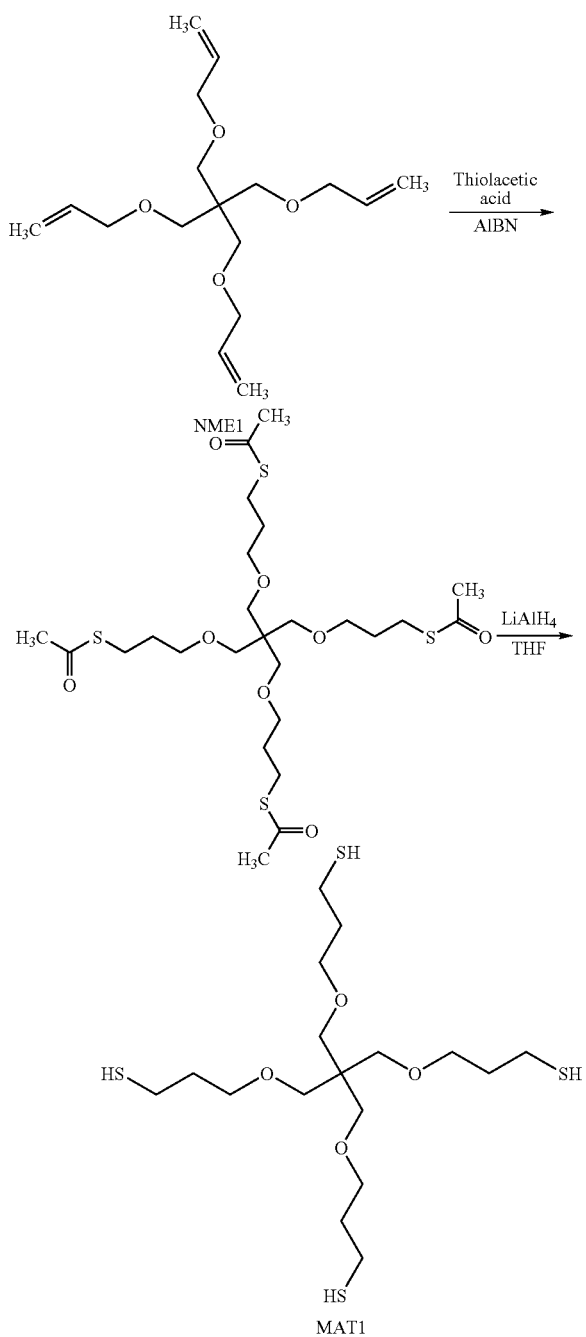

i) Synthesis of Tetrathioacetylpropylpentaerythritol 2.0 g (6.74 mmol) of tetraallylpentaerythritol was added to a 10 ml round bottomed flask fitted with a stirrer. The reagent was cooled on an ice-bath where 4.11 g (53.98 mmol) of freshly distilled thioacetic acid was added in 1 ml portions. After the addition was complete 5 mg of AIBN was added and the reaction mixture stirred for 15 mins. When the AIBN had dissolved the reaction mixture was heated at 60° C. for 12 hours, the reaction being followed by T.L.C. The product of the reaction had an $R_f$ of 0.05 in dichloromethane (DCM) on silica and an $R_f$ of 0.9 in ethanol. The excess thioacetic acid was removed from the reaction mixture under vacuum and the residue applied to a short silica column in the minimum volume of DCM. The column was eluted with 500 mls of DCM followed by 500 mls of ethanol. The ethanol fraction was collected and the solvent removed. 2.9 g of tetrathioacetylpropylpentaerythritol was isolated as a pale yellow oil.

Yield-71.5%

$^1$H NMR (CDCl$_3$) ppm: 3.41 (triplet, 8H) 3.34 (singlet, 8H) 2.92 (triplet, 8H)

2.32 (singlet, 12H) 1.80 (quintet, 8H)

I.R (cm$^{-1}$): 2866.28, 1686.37, 1353.64, 1098.61, 952.97 ii) Synthesis of tetrathiopropylpentaerythritol (MAT1)

1.8 g (2.99 mmol) of tetrathioacetylpropylpentaerythritol was added to 10 ml of anhydrous THF in a 100 ml round bottomed flask and the mixture was degassed with stirring. The reaction vessel was purged with nitrogen and 12.3 mls of 1.00M LiAlH$_4$ in THF was added dropwise. The reaction was allowed to stir at room temperature for 18 hours, the reaction being monitored by T.L.C. (DCM as solvent) When the reaction was complete the mixture was acidified to pH 3 with 0.1 M HCl and 50 mls of DCM added. The organic phase was collected, the aqueous phase extracted with 2×50 mls of DCM. The organic phases were combined and extracted with 4×100 ml brine and 2×50 ml of water. The organic phase was dried over sodium sulphate, filtered and the solvent removed. The product was isolated as a pale yellow oil with a mass of 0.92 g.

Yield-71.2%.

The product was distilled on Kugelrohr apparatus to yield a mobile colourless oil, B.P 230° C. @ 10$^{-4}$ mbar.

$^1$H NMR (CDCl$_3$) ppm: 3.47 (triplet, 8H) 3.34 (singlet, 8H) 2.60 (quartet, 8H)

1.84 (quintet, 8H) 1.38 (triplet, 4H)

I.R (cm$^{-1}$): 2864.30, 1368.40, 1100.51

Synthesis of 4,4'-bis(3-(allyloxymethyl)carbazol-9-yl) (10)

Figure 2:
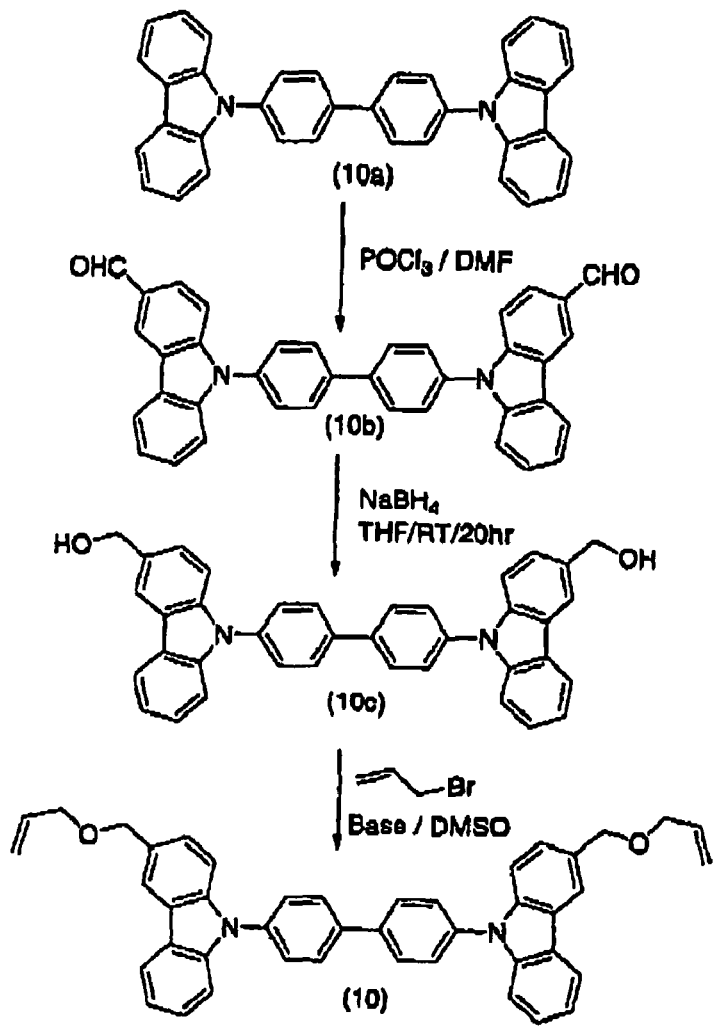
FIG. 2 shows examples of charge-transporting enes.
Figure 2:
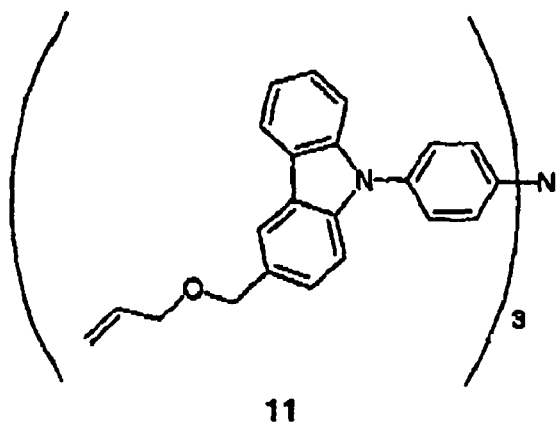

See scheme in FIG. 2.

I) Synthesis of 4,4'-bis(carbazol-9-yl)biphenyl (10a)

Phosphorus tert-butyl phosphine (880 mg, 4.35 mmol) in toluene (88 ml) was added under nitrogen to a deoxygenated mixture of carbazole (11.9 g, 71.0 mmol), 4,4'-dibromobiphenyl (10.0 g, 32.11 mmol), sodium tert-butoxide (23.2 g, 241 mmol) and palladium acetate (324 mg, 1.34 mmol) in toluene (50 ml) and the resulting mixture was heated at reflux under nitrogen for 10 days. The reaction mixture was cooled to room temperature and then diluted with more toluene (200 ml). The reaction mixture was filtered to removes sodium salt and the filtrate was removed all traces of the product. The filtrate was concentrated to dryness to give the crude product as a pale brown solid. The crude product was purified first by chromatography on silica using dichloromethane as the eluent followed by recrystallisation from toluene. The material was then sublimed at 280-281° C. at $10^{-6}$ mm Hg to give the product 4,4'-bis(carbazol-9-yl)biphenyl as an off-white solid with melting point 280-281° C. (lit. m.p. 281° C.).

ii) Synthesis of the 4,4'-bis(3-formylcarbazol-9-yl)biphenyl (10b)

Phosphorus oxychloride (13 ml, 21.5 g, 140 mmol) was added dropwise to a stirring mixture of N,N-dimethylformamide (5.40 ml, 5.10 g, 69.7 mmol) and 4,4'-bis(carbazol-9-yl)biphenyl (7.72 g, 16.0 mmol) and the resulting mixture was stirred at room temperature for 5 minutes then heated to 90° C. for 24 h. (nb reaction mixture was followed by TLC using 5% ethanol/dichloromethane as the eluent). The reaction mixture was poured into water (800 ml) and this beaker was placed in the ultrasonic bath for 2 hours to break up the material. The mixture was stirred for a further 2 hours then filtered. The residue was washed with water and then hexane and dried at the pump for 2 hours. The crude product, a brown solid, was heated with acetone (3×400 ml) and filtered. The product was insoluble in most organic solvent. The impurities were removed by washing with acetone. The product, 4,4'-bis(3-formylcarbazol-9-yl)biphenyl, (7.92 g, 87%) was obtained with melting point 295° C. (dec.). Found: C, 81.74; H, 4.71; and N, 4.45. $C_{38}H_{28}N_2O_2.(CH_3)_2CO$ requires C, 82.25; H, 5.05; N, 4.68%). $^1H$ n.m.r. (300 MHz, $Me_2SO$): δ 10.09 (2H, s, CHO); 8.88 (2H, d, J 0.88 Hz, aromatic H); 8.41 (2H, d, J 7.61 Hz, aromatic H); 8.41 (4H, d, J 8.49. Hz, aromatic H); 8.00 (2H, dd, J 8.49, 1.46 Hz, aromatic H); 7.83 (4H, d, J 8.49 Hz, aromatic H); 7.38-7.61 (8H, m, aromatic H). $\lambda_{max}(CH_2Cl_2)$: 215 nm ($\epsilon$/Lmol$^{-1}$ cm$^{-1}$ 9163), 241 (68 488), 272 (65 928), 294 (67 194) 328 (42 620). FT-IR (solid): 3045, 2825, 2730, 1682, 1623, 1591, 1505, 1456, 1438, 1365, 1319, 1275, 1230, 1180, 802, 745 cm$^{-1}$.

iii) Synthesis of the 4,4'-bis(3-(hydroxymethyl)carbazol-9-yl)biphenyl (10c)

Sodium borohydride (2.40 g, 63.4 mmol)) was added to the 4,4'-bis(3-formyl-carbazol-9-yl)biphenyl (3.42 g, 6.33 mmol) in THF (1.2 L) and the resulting suspension was stirred at room temperature for 24 h. (The reaction was followed by TLC using 5% ethanol/dichloromethane as the eluent). Once the reaction was complete, the mixture was slowly poured into water (400 ml) and the mixture was left to stir at room temperature for a further 30 min. The reaction mixture was acidified to pH 1 with hydrochloric acid (5M). The product was extracted with dichloromethane (3×300 ml). The combined organic phase was washed with water (400 ml) and brine (400 ml), dried (MgSO$_4$), filtered and the filtrate evaporated to dryness. The crude product, was purified by chromatography on silica using 50% THF/toluene as the eluent. The product was recrystallised from ethanol to give 4,4'-bis(3-(hydroxymethyl)carbazol-9-yl) as a pale yellow solid (3.22 g, 94%) with m.p. 268° C. (dec.). Found: C, 82.51; H, 4.64; and N, 4.86. $C_{38}H_{28}N_2O_2.EtOH$ requires C, 81.33; H, 5.80; N, 4.74%). $^1H$ n.m.r. (300 MHz, $Me_0SO$): δ 8.23 (2 H, d, J 7.61 Hz, aromatic H); 8.18 (2H, s, aromatic H); 8.06 (4H, d, J 8, 19 Hz, aromatic H); 7.75 (4H, J 8, 19 Hz, aromatic H); 7.38-7.50 (8H, m, aromatic H); 7.29 (2H, m, aromatic H); 5.25 (2H, t, J 5.58 Hz, OH); 4.68 (4H, d, J 5.56 Hz, CH$_2$). $\lambda_{max}(CH_2Cl_2)$: 216 nm ($\epsilon$/Lmol$^{-1}$ cm$^{-1}$ 177 455), 240 (57 873), 271 (56 595), 294 (55 330) 329 (37 758). FTIR (solid): 3343, 1604, 1500, 1485, 1455, 1362, 1330, 1230, 803, 745 cm$^{-1}$.

iv) Synthesis of 4,4'-bis(3-(allyloxymethyl)carbazol-9-yl) (10)

DMSO was dried over calcium hydride, then distilled under vacuum and stored over molecular sieves.

Potassium hydroxide (2.07 g, 36.9 mmol) was added to DMSO (20 ml) and was stirred under nitrogen at room temperature for 15 min. The diol (2.39 g, 4.39 mmol) in DMSO (20 ml) was then added, followed by allyl bromide (2 ml, 2.80 g, 21.7 mmol) and the resulting mixture was stirred at room temperature under nitrogen overnight. The reaction mixture was poured into water (200 ml) and the product was extracted into dichloromethane (3×50 ml). The organic phases were combined and were washed with water (5×150 ml), brine (200 ml) and dried over magnesium sulfate. The mixture was filtered and the filtrate was evaporated to dryness. The material was purified by chromatography on silica using dichloromethane as the eluent. The relevant fractions were combined and the solvent removed under reduced pressure. The product was triturated from dichloromethane and hexane to give the product as a pale yellow solid with melting point 118-120° C. (Found: C, 82.51; H, 4.64; and N, 4.86. $C_{38}H_{28}N_2O_2.EtOH$ requires C, 81.33; H, 5.80; N, 4.74%). $^1H$ n.m.r. (300 MHz, $Me_2SO$): δ 8.13-8.20 (4H, m, aromatic H); 7.87-7.93 (4H, m, aromatic H); 7.65-7.72 (4H, m, aromatic H); 7.40-7.65 (8H, aromatic H); 7.27-7.35 (2H, m, aromatic H); 5.93-6.09, (2H, m, CH=CH), 5.30-5.39 (2H, m, CH=CH); 5.20-5.29 (2H, m, CH=CH); 4.74 (4H, s, CH$_2$); (8H, m, CH$_2$—CH=CH$_2$). $\lambda_{max}(CH_2Cl_2)$: 241 nm ($\epsilon$/Lmol$^{-1}$ cm$^{-1}$ 88 506), 296 (40 331), 319 (29657). FT-IR (solid): 3047, 2852, 1604, 1500, 1455, 1359, 1331, 1230, 1074, 915, 807, 759 cm$^{-1}$.

Example 2

OLED Device Fabrication and Results

OLED devices were made using different combinations of thiol and ene. In the following examples the thiols were compounds 24 and MAT1 and the enes were compounds 10, 22, and NME1. Tables 1 and 2 show the specific combinations that were used. The procedure for fabricating the devices is as follows.

Ir(ppy)$_3$ (8 wt %), Thiol and Ene were dissolved in pure chloroform at total concentration 5-7 mg ml$^{-1}$. The solutions were spun onto ITO coated glass substrates (previously cleaned by ultrasonication in commercial detergent and thorough rinsing with DI water). Prior to spin-coating the dry ITO coated glass was plasma-treated in an Emitech K1050X plasma unit (process gas oxygen, 100 W, 2 min). Solutions were spun onto the ITO substrates at 2000 rpm with acceleration 500 rs$^{-1}$ for a total of 30 s giving an emitting organic layer of thickness ca 50 nm. Films were then photopolymerized under an inert atmosphere (N$_2$) using a Hanovir UVA 250W UV source. The films were irradiated for 6-8 minutes through a 5"×5" glass photo mask (cut-off 360 nm) giving a rectangular exposed area 15×20 mm. Overlap of this area with ITO anode and deposited aluminium cathode defines active areas consisting of 6 pixels measuring 4×5 mm. The photopolymerized films were developed by rinsing with pure toluene, dried under a stream of dry nitrogen and transferred to the evaporator (KJLesker) for completion of the OLED by evaporation of ETL/HBL and top electrode. TPBI deposited by vacuum evaporation formed the ETL/HBL (50 nm). LiF (1.2 nm) and Aluminium (100-150 nm) deposited by vacuum evaporation formed the cathode.

The device results are shown in tables 1 and 2.

TABLE 1 shows the device performance at a luminance of 100 cd/m²

| Device | Thiol | Ene | mass (mg) ratio thiol:ene:dopant | 100 cd/m² | | |
|---|---|---|---|---|---|---|
| | | | | EQE (cd/A) | PE (lm/W) | Op. V (V) |
| 1 | 24 | 22 | 9.4:10.3:1.3 | 0.90 | 0.28 | 10.2 |
| 2 | 24 | NME1 | 7.8:1.9:0.8 | 2.02 | 1.01 | 6.3 |
| 3 | MAT1 | 10 | 1.8:8.0:0.8 | 9.95 | 3.12 | 10.0 |
| 4 | MAT1 | 10 | 1.8:8.0:0.8 | 8.22 | 3.49 | 7.4 |

TABLE 2 shows the maximum device efficiencies for each device

| Device | Thiol | Ene | Max EQE (cd/A) | Corr. L (cd/m²) | Max PE (lm/W) | Corr. L (cd/m²) | ToV (V) | Max L (@V) (cd/m²) | CIE x, y |
|---|---|---|---|---|---|---|---|---|---|
| 1 | 24 | 22 | 1.0 | 40 | 0.42 | 7.5 | 6.0 | 256 (15.0) | 0.34, 0.59 |
| 2 | 24 | NME1 | 2.03 | 75.9 | 1.05 | 62.7 | 4.8 | 277 (8.0) | 0.33, 0.53 |
| 3 | MAT1 | 10 | — | — | — | — | 6.8 | 265 (15.0) | 0.32, 0.61 |
| 4 | MAT1 | 10 | — | — | — | — | 5.2 | 911 (10.0) | 0.33, 0.61 |

Device 1 is an example of a combination of a charge transporting thiol (24) and a charge transporting ene (22) doped with Ir(ppy)₃.

Device 2 is an example of a combination of a charge transporting thiol (24) and a tetra-functional non-charge transporting ene (NME1) doped with Ir(ppy)₃.

Devices 3 and 4 are examples of a combination of a non-charge transporting tetra-functional thiol (MAT1) and a charge transporting ene (10) doped with Ir(ppy)₃.

Films containing the liquid monomer MAT1 cure quickly, and produce the most efficient devices. It was found that films containing a liquid monomer and a solid monomer tend to cure quicker than films in which both monomers are solid, so it can be advantageous to use a liquid/solid monomer combination. All of these combinations cure without the addition of a separate initiator to the formulation.

The invention claimed is:

1. A composition comprising a mixture of at least one monomer with the formula:

A-(X)ₙ    (1)

and at least one monomer with the formula:

B—(Y)ₘ    (2)

where monomers of formula (1) are polymerisable with monomers of formula (2), n and m are integers greater than or equal to 2, such that n and m may be the same or different, X is a group containing a terminal thiol, Y is a group containing a reactive unsaturated carbon-carbon bond, each X may be the same or different, each Y may be the same or different, and A and B are molecular fragments such that at least one of A or B is an organic charge-transporting or organic light-emitting fragment, said mixture further comprising at least one of an emissive dopant and a charge transporting dopant.

2. A composition according to claim 1, wherein n+m>4.

3. A composition according to claim 1, wherein A, B, X, and Y do not contain any carbonyl groups.

4. A composition according to claim 1, wherein at least one of A and B is a hole-transporting molecular fragment.

5. A composition according to claim 1, wherein at least one of A and B is an electron-transporting molecular fragment.

6. A composition according to claim 1, wherein at least one of A and B is a bipolar-transporting molecular fragment.

7. A composition according to claim 1, wherein at least one of A and B is a luminescent molecular fragment.

8. A composition according to claim 1, further comprising an initiator.

9. A composition according to claim 1, wherein A in the monomer of the formula 1 comprises a group of the formula

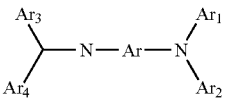

wherein Ar is an optionally-substituted aromatic group and each of Ar₁, Ar₂, Ar₃ and Ar₄ is, independently, an optionally-substituted aromatic or optionally-substituted heteroaomatic group and Ar₁ and Ar₂ and/or Ar₃ and Ar₄ may, optionally, be linked together to form, with the N atom to which they are attached, a N-containing ring, wherein at least two of Ar₁, Ar₂, Ar₃ and Ar₄ are bonded, optionally via a spacer unit, to the group X.

10. A composition according to claim 9, wherein A in the monomer of the formula 1 comprises at least one group of the formula

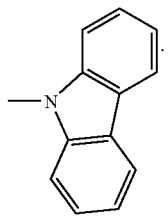

11. A composition according to claim 10, wherein The monomer of the formula I has the formula $(Q_1)_3 N$ where $Q_1$ is

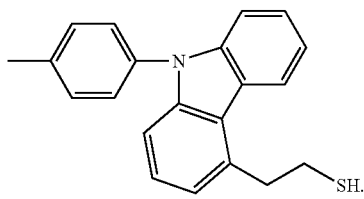

12. A composition according to claim 9, wherein Ar comprises biphenyl.

13. A composition according to claim 1, wherein B in the monomer of the formula 2 comprises a group of the formula

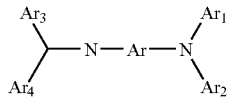

wherein Ar is an optionally-substituted aromatic group and each of $Ar_1$, $Ar_2$, $Ar_3$ and $Ar_4$ is, independently, an optionally-substituted aromatic or optionally-substituted heteroaromatic group and $Ar_1$ and $Ar_2$ and/or $Ar_3$ and $Ar_4$ may, optionally, be linked together to form, with the N atom to which they are attached, a N-containing ring, wherein at least two of $Ar_1$, $Ar_2$, $Ar_3$ and $Ar_4$ are bonded, optionally via a spacer unit, to the group Y.

14. A composition according to claim 13, wherein B in the monomer of the formula 2 comprises at least one group of the formula

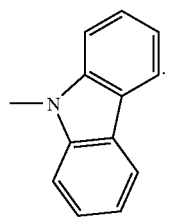

15. A composition according to claim 14, wherein the monomer of the formula 2 has the formula $(Q_2)_3 N$ where $Q_2$ is

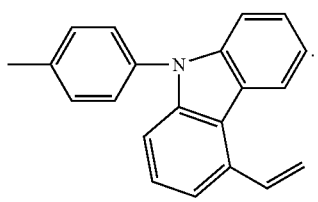

16. A composition according to claim 13, wherein Ar comprises biphenyl.

17. A solid film comprising a thermally-induced or radiation-induced polymerisation reaction product of a composition according to claim 1.

18. An organic light emitting device comprising laminated in sequence a substrate, an electrode, a first optional charge transporting layer, an emissive layer, a second optional charge transporting layer and a counter electrode wherein at least one of the emissive layer, the first optional charge transporting layer or the second optional charge transporting layer is a film according to claim 17.

19. A process for forming a device as claimed in claim 18 that comprises the steps of:
   i) depositing a film of a composition comprising a mixture of at least one monomer with the formula:

A-(X)$_n$ (1)

and at least one monomer with the formula:

B—(Y)$_m$ (2)

where monomers of formula (1) are polymerisable with monomers of formula (2), n and m are integers greater than or equal to 2, such that n and m may be the same or different, X is a group containing a terminal thiol, Y is a group containing a reactive unsaturated carbon-carbon bond, each X may be the same or different, each Y may be the same or different, and A and B are molecular fragments such that at least one of A or B is an organic charge-transporting or organic light-emitting fragment, said mixture further comprising at least one of an emissive dopant and a charge transporting dopant; and
   ii) polymerising said composition.

20. A process according to claim 19, comprising exposing at least portions of the film of said composition to actinic radiation to polymerise the corresponding portions of the film.

21. A process according to claim 20, comprising exposing the film to actinic radiation through a mask and then developing the film to remove the unexposed portions of the film.

22. A device as in claim 18, wherein the light emitting layer contains an emissive dopant.

23. An organic light emitting device comprising laminated in sequence a substrate, an electrode, a first optional charge transporting layer, an emissive layer, a second optional charge transporting layer and a counter electrode wherein the emissive layer is a film according to claim 17.

24. A process for forming a device as claimed in claim 23 that comprises the steps of:
   i) depositing a film of a composition that is capable of emitting light of a first colour said composition comprising a mixture of at least one monomer with the formula:

A-(X)$_n$ (1)

and at least one monomer with the formula:

B—(Y)$_m$ (2)

where monomers of formula (1) are polymerisable with monomers of formula (2), n and m are integers greater than or equal to 2, such that n and m may be the same or different, X is a group containing a terminal thiol, Y is a group containing a reactive unsaturated carbon-carbon bond, each X may be the same or different, each Y may be the same or different, and A and B are molecular fragments such that at least one of A or B is an organic charge-transporting or organic light-emitting fragment, said mixture further comprising at least one of an emissive dopant and a charge transporting dopant;

ii) exposing portions of said film to actinic radiation through a mask to polymerise the corresponding portions of the film;

iii) removing unexposed portions of said film to leave a pre-determined pattern;

iv) depositing a film of said composition that is capable of emitting light of a second colour; and v) exposing portions of said second colour film to actinic radiation through a mask to polymerise the corresponding portions of the film.

25. A device as in claim 23, wherein the light emitting layer contains an emissive dopant.

26. A process for forming a device as claimed in claim 23 that comprises the steps of:

i) depositing a film of a composition comprising a mixture of at least one monomer with the formula:

$$A\text{-}(X)_n \qquad (1)$$

and at least one monomer with the formula:

$$B\text{---}(Y)_m \quad (2)$$

where monomers of formula (1) are polymerisable with monomers of formula (2), n and m are integers greater than or equal to 2, such that n and m may be the same or different, X is a group containing a terminal thiol, Y is a group containing a reactive unsaturated carbon-carbon bond, each X may be the same or different, each Y may be the same or different, and A and B are molecular fragments such that at least one of A or B is an organic charge-transporting or organic light-emitting fragment, said mixture further comprising at least one of an emissive dopant and a charge transporting dopant; and ii) polymerising said composition.

27. A process according to claim 26, comprising exposing at least portions of the film of said composition to actinic radiation to polymerise the corresponding portions of the film.

28. A process according to claim 27, comprising exposing the film to actinic radiation through a mask and then developing the film to remove the unexposed portions of the film.

29. A solid film comprising a radiation-induced polymerisation reaction product of a composition according to claim 1 that has a pre-determined pattern.

30. An organic light emitting device comprising laminated in sequence a substrate, an electrode, a first optional charge transporting layer, an emissive layer, a second optional charge transporting layer and a counter electrode wherein at least one of the emissive layer, the first optional charge transporting layer or the second optional charge transporting layer is a film according to claim 29.

31. A device as in claim 30, wherein the light emitting layer contains an emissive dopant.

32. An organic light emitting device comprising laminated in sequence a substrate, an electrode, a first optional charge transporting layer, an emissive layer, a second optional charge transporting layer and a counter electrode wherein the emissive layer is a film according to 29.

33. A device as in claim 32, wherein the light emitting layer contains an emissive dopant.

* * * * *

UNITED STATES PATENT AND TRADEMARK OFFICE
CERTIFICATE OF CORRECTION

| | | |
|---|---|---|
| PATENT NO. | : 7,829,203 B2 | Page 1 of 1 |
| APPLICATION NO. | : 10/506985 | |
| DATED | : November 9, 2010 | |
| INVENTOR(S) | : Annette Steudel et al. | |

It is certified that error appears in the above-identified patent and that said Letters Patent is hereby corrected as shown below:

On the Cover Page:

At field (30), "0205592.9" should be -- 0205592.2 --.

In the Specification:

At Column 1, line 23, "fulfil" should be -- fulfill --.
At Column 1, line 67, "demonstrate" should be -- demonstrates --.

In the Claims:

At Column 20, line 45, "heteroaomatic" should be -- heteroaromatic --.
At Column 21, line 1, "The" should be -- the --.

Signed and Sealed this
Third Day of May, 2011

David J. Kappos
*Director of the United States Patent and Trademark Office*